United States Patent [19]

Fujita

[11] 4,008,436
[45] Feb. 15, 1977

[54] CHANNEL SELECTING APPARATUS

[75] Inventor: Yoshitoshi Fujita, Yokohama, Japan

[73] Assignee: Victor Company of Japan, Limited, Japan

[22] Filed: May 23, 1975

[21] Appl. No.: 580,359

[30] Foreign Application Priority Data

May 27, 1974 Japan .............................. 49-59697

[52] U.S. Cl. .................................. 325/335; 325/470
[51] Int. Cl.² ............................................ H04B 1/36
[58] Field of Search ...................... 334/15, 16, 29; 200/DIG. 1, DIG. 2; 307/239; 331/1 A, 16, 179; 340/258 R, 279; 325/421, 422, 464, 469, 470

[56] References Cited

UNITED STATES PATENTS

| | | | |
|---|---|---|---|
| 3,614,621 | 10/1971 | Chapman et al. | 325/469 X |
| 3,845,394 | 10/1974 | Hamada | 325/470 X |
| 3,864,637 | 2/1975 | Kanow | 325/421 X |

*Primary Examiner*—Benedict V. Safourek
*Attorney, Agent, or Firm*—Robert E. Burns; Emmanuel J. Lobato; Bruce L. Adams

[57] ABSTRACT

First, second and third manual control switches are arranged side by side in close proximity to each other, the first switch for initiating the upward sweep of frequency at a low sweep rate, the third switch for initiating the downward sweep of frequency at the same sweep rate, and the second or intermediate switch for switching the sweep rate to a higher rate. A counter having up- and down-counting modes of operation is provided, the modes of which are under the control of the first and third switches. The up-down counter is supplied with pulses at a low repetition frequency when either the first or third switch is operated and with pulses at a high repetition frequency when the second switch is operated. The local oscillations of a radio receiver are under the control of the output of a comparator connected in a phase-locked loop including the local oscillator of a radio receiver, a programmable counter and the comparator. The programmable counter is under the control of the output signal from the up-down counter to vary the number of peaks of the local oscillation to be counted thereby for each output thereof, the output frequency from the programmable counter is compared with a reference frequency which is a fraction of the frequency to be tuned to produce a voltage for controlling the frequency of the local oscillator.

3 Claims, 4 Drawing Figures

CHANNEL SELECTING APPARATUS

BACKGROUND OF THE INVENTION

The present invention relates to tuning systems and more particularly to an improved automatic tuning system for selecting one of individual stations or channels.

Tuning of communication receivers has heretofore been accomplished by mechanical devices or electromechanical devices, thus, gear trains, servo mechanisms including servo motors for operating variable capacitors, inductors and the like have been the conventional devices used for tuning.

SUMMARY OF THE INVENTION

It is a feature of the present invention to eliminate mechanical tuning mechanisms and yet provide for automatic tuning of a receiver to any desired frequency in a convenient manner.

Another feature of the invention is to provide an improved control system for tuning a receiver or other tuning network which is digitally controlled.

A further feature of the invention is to provide an improved tuning system in which tuning speed can be selected by manual instantaneous contact with one or two of a set of three sensing plates associated with contact detecting circuits, the sensing plates being arranged side by side in close proximity to each other.

Still another feature of the invention is to provide an improved tuning system in which the tuning network is swept by the step of a fraction of the frequency to be tuned.

Briefly described, a radio receiver system embodying the invention is capable of handling signals having any frequency contained in a band of frequencies. The system may have a varactor tuning network such as a synthesizer or local oscillator providing injection signals to a mixer, the output of which provides inputs to an intermediate frequency selection network having a pass band at a given intermediate frequency. When the system is tuned to the frequency which when mixed with the injection frequency results in the intermediate frequency.

The channel selection apparatus of the invention controls the aforementioned tuning means and comprises a phase-locked loop including the varactor tuning network, a variable counter and a frequency phase comparator or detector. The variable counter is used to demultiply the frequency of the oscillation of the local oscillator to a fraction of the frequency tuned which is compared with a reference frequency to provide a control voltage. The control voltage is applied to the varactor tuning network to shift the frequency. The variable counter is under the control of a signal supplied from an up-down counter which counts the number of regularly occurring pulses supplied thereto and converts the count continuously into a binary number as long as the input pulses are applied thereto. The up-down counter has up-counting and down-counting modes of operation which can be manually selected by a set of control switches. As long as the pulses are delivered to the up-down counter, the variable counter continues to vary the number of pulses to be counted thereby for each output thereof. Upon the system being tuned to a station, the mixer output at the intermediate frequency prevent delivery of pulses to the up-down counter, thus resetting the channel selecting apparatus.

A set of first, second and third contact sensing switches or touch plates is provided to facilitate tuning at a desired sweep rate. The first and third switches are used respectively for selection of the modes of operation of the up-down counter, while at the same time to couple the low sweep rate pulses to the up-down counter. The second switch is located intermediate the first and third switches and used to switch the sweep rate from the low to high rate, while at the same time the first or third switch being contacted with the operator's finger.

BRIEF DESCRIPTION OF THE DRAWINGS

Other features and advantages of the invention will be apparent from the following description taken in conjunction with the accompanying drawings, in which.

DESCRIPTION OF THE PREFERRED EMBODIMENTS

Figure 1A:
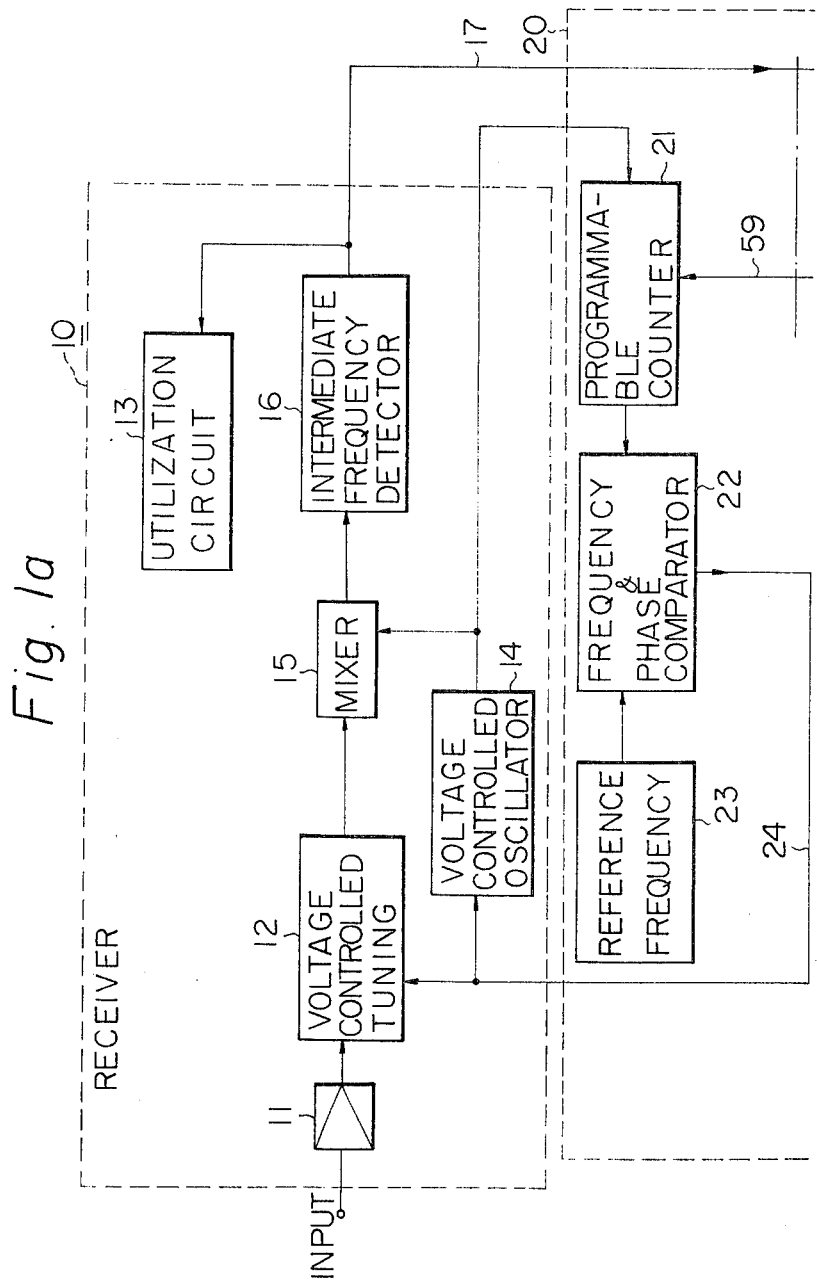
FIGS. 1A and 1B are a block diagram of the automatic tuning system, connected to tune a conventional radio receiver.
Figure 1B:
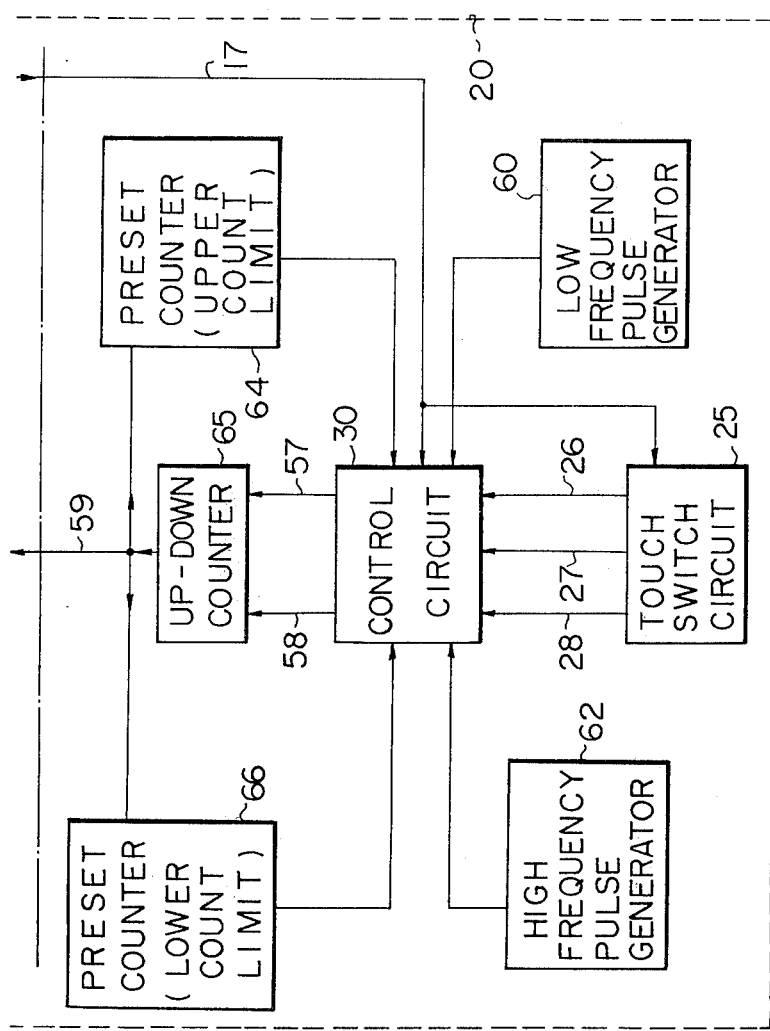

Referring now to FIGS. 1A and 1B, a channel selecting apparatus embodying the invention is schematically shown. Numeral 10 indicates generally in a dashed rectangle a portion of a radio receiver to which the present invention is applicable. It is to be noted that the present invention is not to be restricted to use in a radio receiver, but the invention can also be applied to any communication receiver. A radio wave signal from a transmitting station is intercepted by an antenna (not shown) and amplified by an RF amplifier 11. The amplified signal is passed through a voltage-controlled tuning network 12 which may include conventional voltage variable capacitors or varactors. The tuning circuit 12 allows the only signal at a tuned frequency to pass therethrough under the control of a signal which will be described later. A voltage-controlled local oscillator 14 generates a carrier frequency in the range from 60 to 80 MHz, for example, and applies its output signal to a mixer 15 to which the output from voltage-controlled tuning circuit 12 is also applied. At the output of the mixer 15 appears the signal at the intermediate frequency. An intermediate frequency detector 16 produces an output when the input signal is at the intermediate frequency and applies it to a utilization circuit 13 of the receiver 10 and to a channel selecting circuit 20 on lead 17. The voltage-controlled oscillator 14 is also under the control of the aforementioned control signal.

The channel selecting circuit 20 includes a programmable counter 21 which functions to count the number of pulses applied thereto and produces an output at a predetermined number of counts. The number of the pulses to be counted for each output is variable under the control of a signal which will be described below. The programmable counter 21 is described in an Application Note AN621 printed for instruction purposes by Motorola. The output signal from the counter 21 is applied to a frequency-and-phase detector or comparator 22 to which is also applied the output signal from a reference frequency generator 23. The reference frequency generator 23 generates a signal at a constant frequency, for example, 100 kHz which is a fraction of the frequency to be tuned. The comparator 22 compares the frequency and phase of the two input signals and produces a control voltage which is fed to the voltage-controlled tuning circuit 12 and the oscillator 14 on conductor 24. The comparator output is used to control the voltage variable capacitors of these circuits to shift the frequency by the steps of 100 kHz until phase locked condition is established in the loop including oscillator 14, counter 21, and comparator 22.

Figure 3:
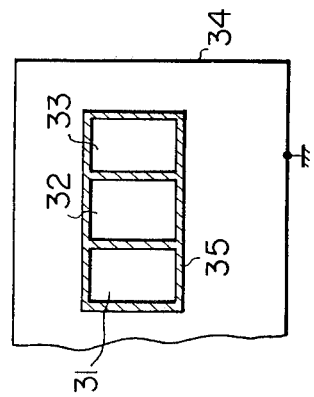
FIG. 3 is a fragmentary section view of an arrangement of the contact sensing plates or touch plates used in the contact sensing circuit of FIG. 2.
Figure 2:
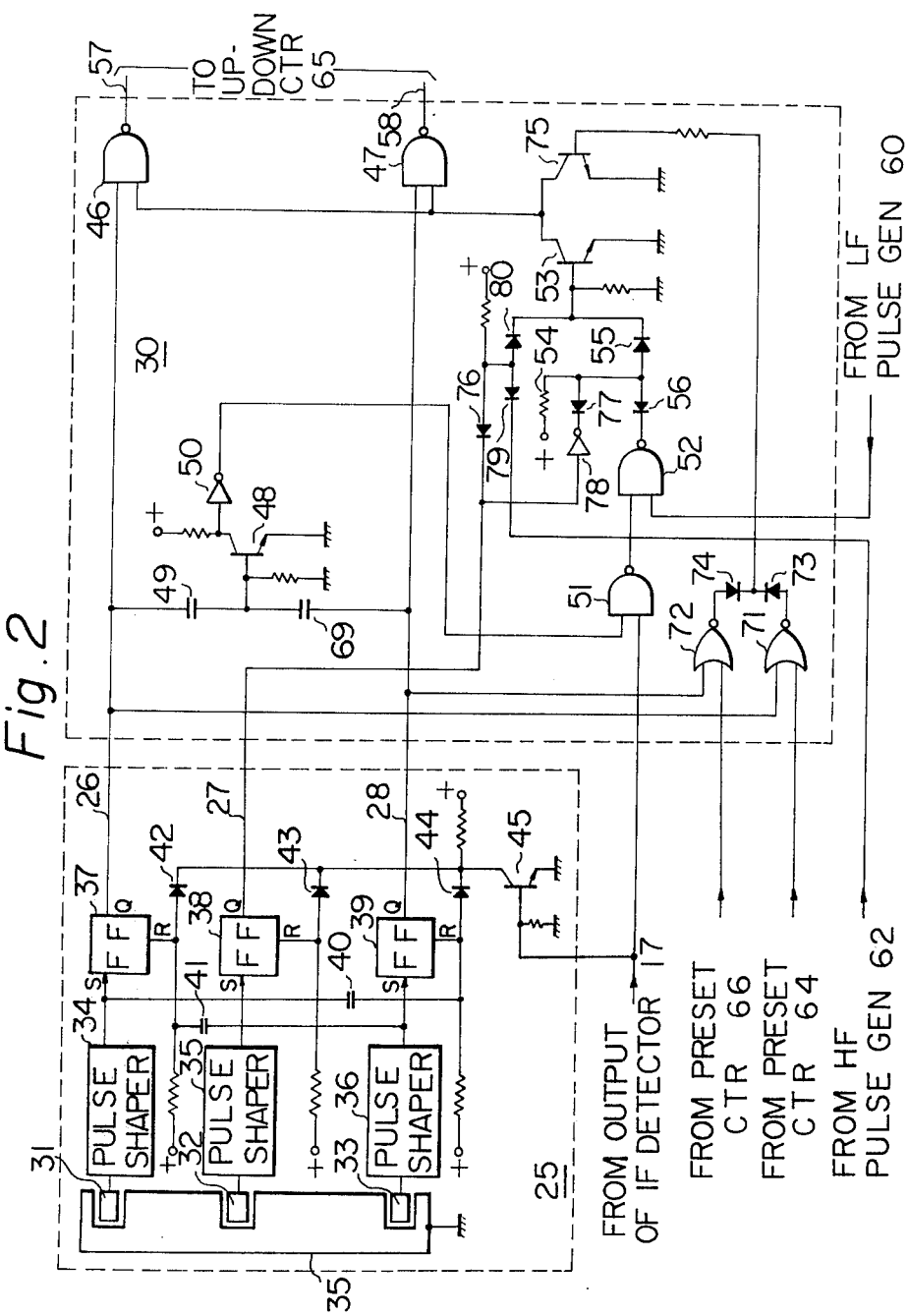
FIG. 2 is a detailed diagram of the contact sensing or touch switch circuit and the control circuit of the tuning system of FIG. 1.

The channel selecting circuit 20 further includes a touch switch or contact sensing circuit 25 which delivers an instruction signal on leads 26, 27, 28 to a control circuit 30. In FIG. 2, the touch switch circuit 25 comprises a frequency up-sweep metal tab 31, a high-speed control tab 32 and a frequency down-sweep tab 33, all of which are arranged in a side-by-side relation in the order named as shown in FIG. 3. These tabs are insulatively supported on a panel 34 which is connected to ground and separated by an insulator from each other. Each of the metal tabs 31, 32 and 33 is connected to each of pulse shaping circuits 34, 35, and 36 which amplifies the hum noise introduced when the operator brings his finger into contact therewith. The output circuits of these pulse shaping circuits are connected to the set terminal of flip-flops 37, 38 and 39. The output of pulse shaper 34 is further coupled through a capacitor 40 to the reset terminal of flip-flop 39, while the output of pulse shaper 36 is further coupled through a capacitor 41 to the reset terminal of flip-flop 37. The reset terminals of flip-flops 37, 38 and 39 are further connected through diodes 42, 43 and 44 in common to the collector of transistor 45.

Assume that the operator wish to shift the frequency of the receiver to a higher frequency channel, sweep-up tab 31 is in contact with the tip of his finger so that it is capacitively coupled through the body of the operator to ground. Noise will be generated at the input to the pulse shaping circuit 34 which amplifies the noise signal so as to sharply define the rising edge of the signal waveform. The output signal from the pulse shaper 34 sets the flip-flop 37 and resets the flip-flop 39. The Q output of flip-flop 37 goes high and enables NAND gate 46 of the control circuit 30 through conductor 26. The output signal from flip-flop 37 is also applied to the base of a transistor 48 via capacitor 49 and turns it on. A low level pulse is generated at the collector of transistor 48 and its polarity is reversed inverter 50 which couples a high level pulse to a NAND gate 51. When the tuning circuit 12 is tuned to the frequency of a given channel, the intermediate frequency detector 16 delivers its output signal to the NAND gate 51 and the output level of the NAND gate 51 will go low. Otherwise, the output of NAND gate 51 is kept at a high level to enable NAND gate 52. To the other input terminal of NAND gate 52 is applied a train of pulses regularly occurring at a low repetition rate supplied from a low frequency pulse generator 60. Low-level pulse occurs at the output of NAND gate 52 during the coincidence of the two input signals.

On the other hand, a transistor 53 has its base coupled to a positive bias source through a resistor 54 and a forward-biased diode 55 and thus remains normally conductive. A diode 56 which is coupled to the output of NAND gate 52 is turned on and off in correspondence with the output therefrom so that the transistor 53 is correspondingly switched to the on and off states. The output signal from the transistor 53 is passed through the NAND gate 46 on lead 57 to up-down counter 65. The up-down counter 65 may be of a Model SN74192N of Texas Instruments and operates in up-counting and down-counting modes of operation and is used to represent the number of the input pulses in binary notation and transfers the binary number via a plurality of leads 59 (only one is shown for simplicity) to programmable counter 21 in order to control the number of pulses to be counted thereby for each output therefrom. The counter 21 thus functions to demultiply the pulse repetition frequency of the input signal to a predetermined frequency, in this case, 100 kHz, for the purpose of checking it against the reference frequency.

Assume that the voltage-controlled oscillator 14 is generating a signal at a frequency of 65 MHz and the count in the up-down counter 65 has increased from 650 to 651. This reduces the output frequency of the signal from the programmable counter to a frequency lower than 100 kHz. The frequency comparator 22 will produce an output which varies the frequency of both the tuning circuit 12 and the oscillator 14 to a value higher than 65 MHz. The output signal from the oscillator 14 is then fed back to the programmable counter 21 where it undergoes a lowering of frequency by a factor of 651. The output from the frequency comparator 22 is present until the frequency of the oscillator 14 has been increased to 65.1 MHz and the phase of the output signal from the programmable counter 21 is brought into coincidence with that of the reference frequency so that a phase-locked condition is reestablished through the loop at 65.1 MHz. As long as the up-down counter 65 is updated by the control circuit 30, the frequency of the tuning circuit 12 and the local oscillator 14 will be varied by the step of 100 kHz until the intermediate frequency detector 16 detects the signal of a station.

Upon the detection of the signal, detector 16 applies a reset signal on lead 17 to the touch switch circuit 25 and the control circuit 30. In the switching circuit 25, the reset signal is applied to the base of transistor 45, causing it to switch to the nonconductive state so that flip-flop 37 is reset. In the control circuit 30, the reset signal is applied to NAND gate 51 and thus NAND gate 52 is caused to cease delivery of pulses to transistor 53 through diodes 56 and 55, thereby the frequency up-sweep is terminated.

In a manner similar to that described above, frequency down-sweep is also effected by a manual contact with the down-sweep touch plate 33 of the touch switch circuit 25. In this instance, flip-flop 39 is switched to the set condition, while flip-flop 37 is switched to the reset state through capacitor 41. The potential at conductor 28 coupled to the Q output of flip-flop 39 goes high and enables NAND gate 47. The high potential on conductor 28 is coupled through capacitor 69 to the base of transistor 48 which in turn is switched to the conduction state in a manner similar to that described before. The low frequency pulses will be delivered at the output of transistor 53 and gated by the NAND gate 47 through conductor 58 to the down-count terminal of up-down counter 65. Counter 65 initiates down counting of the pulse supplied from the control circuit 30 in order that the number of pulses to be counted by the programmable counter 21 is decreased from, for example, 650 to 649. Frequency comparator 22 delivers a control signal which varies the voltage-controlled tuning elements of the circuit 12 and oscillator 14 to decrease their frequencies. The same process will be repeated until a phase-locked condition prevails in the loop by the step of 100 kHz. The frequency is thus stepped down to the adjacent channel whereupon the intermediate frequency detector 16 produces an output which resets the flip-flop 39 of touch switch circuit 25 and disables the NAND gate 47 of control circuit 30.

To sweep the frequency up or down further, it is only necessary that the operator has to bring his finger in contact with sweep-up plate 31 or sweep-down plate 33 of the touch switch circuit 25 again.

In order to detect when the frequency has reached the upper or lower frequency limit, an upper end gate 64 and a lower end gate 66 are provided. These gates are of a preset type binary counter which produces an output when the content thereof reaches a predetermined number of count. The preset counter 64 has its input coupled in parallel with the programmable counter 21 to the output of up-down counter 65 and its output coupled to a NOR gate 71 of control circuit 30. The signal from counter 64 is passed through NOR gate 71 and diodes 73 and applied to the base of transistor 75. Transistor 75 is turned on to inhibit NAND gate 46 to stop the delivery of pulses to the up-down counter 65. Likewise, the preset counter 66 for detection of the lower frequency limit has its input coupled in parallel with the programmable counter 21 to the output of up-down counter 65 and its output coupled to a NOR gate 72 of the control circuit 30 in order to disable NAND gate 47 when the preset counter 66 has reached a predetermined binary number representative of the lower frequency limit.

Since it is often desirable to sweep the frequency at a higher rate, a high frequency pulse generator 62 is provided. To effect the high-speed frequency up-sweep, the operator has to touch the up-sweep plate 31 and a high-speed sweep plate 32 simultaneously. The high-level signal on conductor 26 opens the NAND gate 46, while the high-level potential on conductor 27 coupled to the output of flip-flop 38 turns off diode 76 and turns on diode 77 by means of inverter 78. The turn-on of diode 77 draws much current from the power supply through resistor 54 and turns off diode 56 to prevent the delivery of pulses from the low-frequency pulse generator 60. The turn-off of diode 76 causes diode 79 to turn on and allows the train of high-repetition pulses from high-frequency pulse generator 62 to be applied through diodes 79 and 80 to the base of transistor 53. Transistor 53 is switched on and off at the high repetition rate and its output is gated through the NAND gate 46 and sweeps the up-down counter 65 at a high rate toward the high frequency side.

Similarly, manual contact of down-sweep plate 33 and high-speed sweep plate 32 at the same time will cause the up-down counter 65 to sweep down the frequency at a high speed.

It will be understood that since the touch plates 31, 32 and 33 are arranged side-by-side in close proximity to each other with the high-speed plate 32 being positioned intermediate the up- and down-sweep plates 31 and 33, the dual rate frequency sweep is achieved simply by contacting the operator's finger with the plate 31 or 33 singly or in combination with the plate 32.

What is claimed is:

1. In a receiver having a voltage-controlled local oscillator means for generating different frequency oscillations to tune the receiver to different tunable frequencies, mixer means responsive to received signals and said oscillations to produce an output signal, and utilization means coupled to said mixer means for utilizing in said receiver said output signal, channel selecting apparatus comprising:

means for generating a variable binary number and including means for generating first and second trains of pulses at different repetition frequencies, an up-down binary counter having count-up and count-down modes of operation for counting said trains of pulses to produce a binary number;

manual means including a grounded metal support, first, second and third metal contact plates insulatively supported on said metal support and arranged side by side in close proximity to each other, first, second and third amplifier means respectively coupled to said first, second and third contact plates, means coupling said first amplifier means to said binary counter to operate the same in said count-up mode, means coupling said third amplifier means to said binary counter to operate the same in said count-down mode, and gate circuit means for gating said first train of pulses to said counter under the control of the signal from said first and third amplifier means, means coupling said second amplifier means to said gating means for gating said second train of pulses to said binary counter while inhibiting said first train of pulses;

a phase-locked loop including said voltage-controlled means, means coupled to said oscillator for demultiplying the oscillation frequency thereof by a factor of said variable binary number, and means for comparing said demultiplied frequency with a reference frequency to produce a control voltage, said control voltage being supplied to said voltage-controlled means; and means responsive to said output signal to cause said up-down binary counter to stop counting when said system is tuned to a selected channel.

2. Channel selecting apparatus as claimed in claim 1, wherein said manual selecting means includes first, second and third flip-flops connected respectively to said first, second and third amplifier means, said first flip-flop being arranged to be set by said first amplifier means and reset by said third amplifier means, said third flip-flop being arranged to be set by said third amplifier means, said first, second and third flip-flops being arranged to be reset when said system is tuned to said selected channel.

3. Channel selecting apparatus as claimed in claim 1, further comprising a first preset counter for detecting the upper frequency limit of said received signals and coupled to said gate circuit means for disabling the same to prevent delivery of said trains of pulses, and a second preset counter for detecting the lower frequency limit of said received signals and coupled to said gate circuit means for disabling the same to prevent delivery of said trains of pulses.

* * * * *